(12) United States Patent
Chen et al.

(10) Patent No.: US 10,645,838 B2
(45) Date of Patent: May 5, 2020

(54) SLIDE RAIL ASSEMBLY AND CABLE MANAGEMENT DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Zong-Sian Wong, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 259 days.

(21) Appl. No.: 15/484,431

(22) Filed: Apr. 11, 2017

(65) Prior Publication Data

US 2018/0063986 A1 Mar. 1, 2018

(30) Foreign Application Priority Data

Aug. 31, 2016 (TW) .............................. 105128339 A

(51) Int. Cl.
| | |
|---|---|
| H05K 7/14 | (2006.01) |
| F16L 3/015 | (2006.01) |
| H05K 7/18 | (2006.01) |
| G06F 1/18 | (2006.01) |
| F16L 3/08 | (2006.01) |
| H02G 11/00 | (2006.01) |
| H02G 3/04 | (2006.01) |
| F16L 3/10 | (2006.01) |

(52) U.S. Cl.
CPC ............ *H05K 7/1491* (2013.01); *F16L 3/015* (2013.01); *H05K 7/1492* (2013.01); *H05K 7/183* (2013.01); *F16L 3/10* (2013.01); *H02G 3/0456* (2013.01); *H02G 11/00* (2013.01)

(58) Field of Classification Search
CPC ..... F16L 3/015; H05K 7/1491; H05K 7/1492; H05K 7/183; G06F 1/18
USPC ............... 248/70, 282.1, 276.1; 211/26, 175; 174/69; 312/223.1; 361/679.01, 683, 361/826
See application file for complete search history.

(56) References Cited

U.S. PATENT DOCUMENTS

| | | | | |
|---|---|---|---|---|
| 6,070,742 | A * | 6/2000 | McAnally | H05K 7/1491 211/26 |
| 6,305,556 | B1 * | 10/2001 | Mayer | G06F 1/18 211/175 |
| 6,600,665 | B2 | 7/2003 | Lauchner | |
| 7,472,795 | B2 | 1/2009 | Dubon et al. | |
| 7,554,819 | B2 | 6/2009 | Chen et al. | |
| 8,387,933 | B2 | 3/2013 | Yu et al. | |
| 8,780,538 | B2 * | 7/2014 | Fu | H02G 11/006 361/679.02 |

(Continued)

*Primary Examiner* — Tan Le

(74) *Attorney, Agent, or Firm* — Rosenberg, Klein & Lee

(57) ABSTRACT

A cable management device includes a supporting base, a first set of arms, and a second set of arms. The first set of arms include two arms that are movable with respect to each other. One of the two arms of the first set of arms is movably mounted on the supporting base. The second set of arms also include two arms that are movable with respect to each other. The second set of arms are connected to the first set of arms.

11 Claims, 8 Drawing Sheets

(56) References Cited

U.S. PATENT DOCUMENTS

| | | | | |
|---|---|---|---|---|
| 8,882,055 | B2* | 11/2014 | Yang | H05K 7/1491 |
| | | | | 174/69 |
| 9,668,372 | B2* | 5/2017 | Chen | H05K 7/1491 |
| 9,706,690 | B2* | 7/2017 | Liu | H05K 7/20909 |
| 10,333,286 | B2* | 6/2019 | Chen | H04Q 1/06 |
| 2015/0271945 | A1* | 9/2015 | Chen | H05K 7/1491 |
| | | | | 248/70 |
| 2015/0342081 | A1* | 11/2015 | Chang | H05K 7/18 |
| | | | | 361/679.02 |
| 2018/0048130 | A1* | 2/2018 | Chen | H04Q 1/06 |

* cited by examiner

SLIDE RAIL ASSEMBLY AND CABLE MANAGEMENT DEVICE THEREOF

FIELD OF THE INVENTION

The present invention relates to a cable management device and more particularly to one applicable to a slide rail or a rack system.

BACKGROUND OF THE INVENTION

Generally, an object to be supported in a rack system is mounted to a rack via a pair of slide rail assemblies, wherein the object may be a server, a power supply, or the like and typically has cables. In order to place the cables of the object properly, cable management assemblies or cable management arms were developed.

U.S. Pat. No. 6,600,665 B2, for example, discloses a cable management arm assembly for a computer server. According to FIG. 6 of this US patent, a slide assembly (14) includes an outer slider member (16), an intermediate slidable member (18), and an inner slidable member (26). The cable management arm assembly includes a stabilizing arm (54), an outer arm (48), and an inner arm (42), the latter two of which are connected to each other. One end of the outer arm (48) is pivotally connected to the stabilizing arm (54) by a pivot pin (160), and one end of the inner arm (42) is connected to the inner slidable member (26) by an inner arm slide bracket (44). The contents disclosed in this US patent are incorporated herein by reference.

While the afore-cited patent provides a cable management arm assembly on which cables can be placed, it is sometimes required that the extended length of a slide rail assembly be increased (i.e., the maximum distance for which a movable member of the slide rail assembly can be moved with respect to the stationary member of the slide rail assembly may have to increase) to meet market demands, and in that case, the foregoing cable management arm assembly, which has only two arm sections and hence a relatively limited extended length, may have problem working with such a slide rail assembly.

SUMMARY OF THE INVENTION

The present invention relates to a multi-section cable management device for use in a rack system designed for electronic equipment.

According to one aspect of the present invention, a cable management device includes a supporting base, a first set of arms, and a second set of arms. The first set of arms include two arms that can move with respect to each other, wherein one of the two arms of the first set of arms is movably mounted on the supporting base. The second set of arms also include two arms that can move with respect to each other. The second set of arms are connected to the first set of arms.

In some embodiments, the second set of arms are pivotally connected to the first set of arms.

In some embodiments, one of the two arms of the second set of arms has an end portion pivotally connected to an end portion of the other of the two arms of the first set of arms.

In some embodiments, the two arms of the first set of arms are pivotally connected to each other, and so are the two arms of the second set of arms.

In some embodiments, the supporting base includes a supporting portion. One of the two arms of the first set of arms is movably mounted on the supporting portion. Preferably, the supporting base further includes a wing portion that serves as a means by which to mount the supporting base to an article.

In some embodiments, the supporting portion includes at least one rib for supporting the first set of arms and/or the second set of arms.

According to another aspect of the present invention, a slide rail assembly includes a first rail, a second rail, and the cable management device in any one of the foregoing embodiments. The second rail is movable with respect to the first rail and the supporting base. The second set of arms and the first set of arms are movable from a first state to a second state in response to the second rail moving with respect to the first rail from a first position to a second position.

In some embodiments, one of the two arms of the second set of arms is movable in response to the second rail moving with respect to the first rail from the first position to the second position.

In some embodiments, the slide rail assembly further includes a third rail movably mounted between the first rail and the second rail, and the supporting base is mounted on the first rail.

In some embodiments, the slide rail assembly is adapted for mounting an object to a rack. The first rail is mountable on a first post and a second post of the rack. The second rail can move with respect to the first rail and is mountable with the object. The third rail is movably mounted between the first rail and the second rail. The supporting base is fixed in position with respect to the first rail. Preferably, the supporting base is mounted on either a third post of the rack or the first rail. Moreover, the first set of arms and the second set of arms preferably have a cable management feature where a cable of the object can be placed.

BRIEF DESCRIPTION OF THE DRAWINGS

FIG. 4 is a partial enlarged view of FIG. 2, showing that one of the arms is mounted on a supporting base;

DETAILED DESCRIPTION OF THE INVENTION

Figure 1:
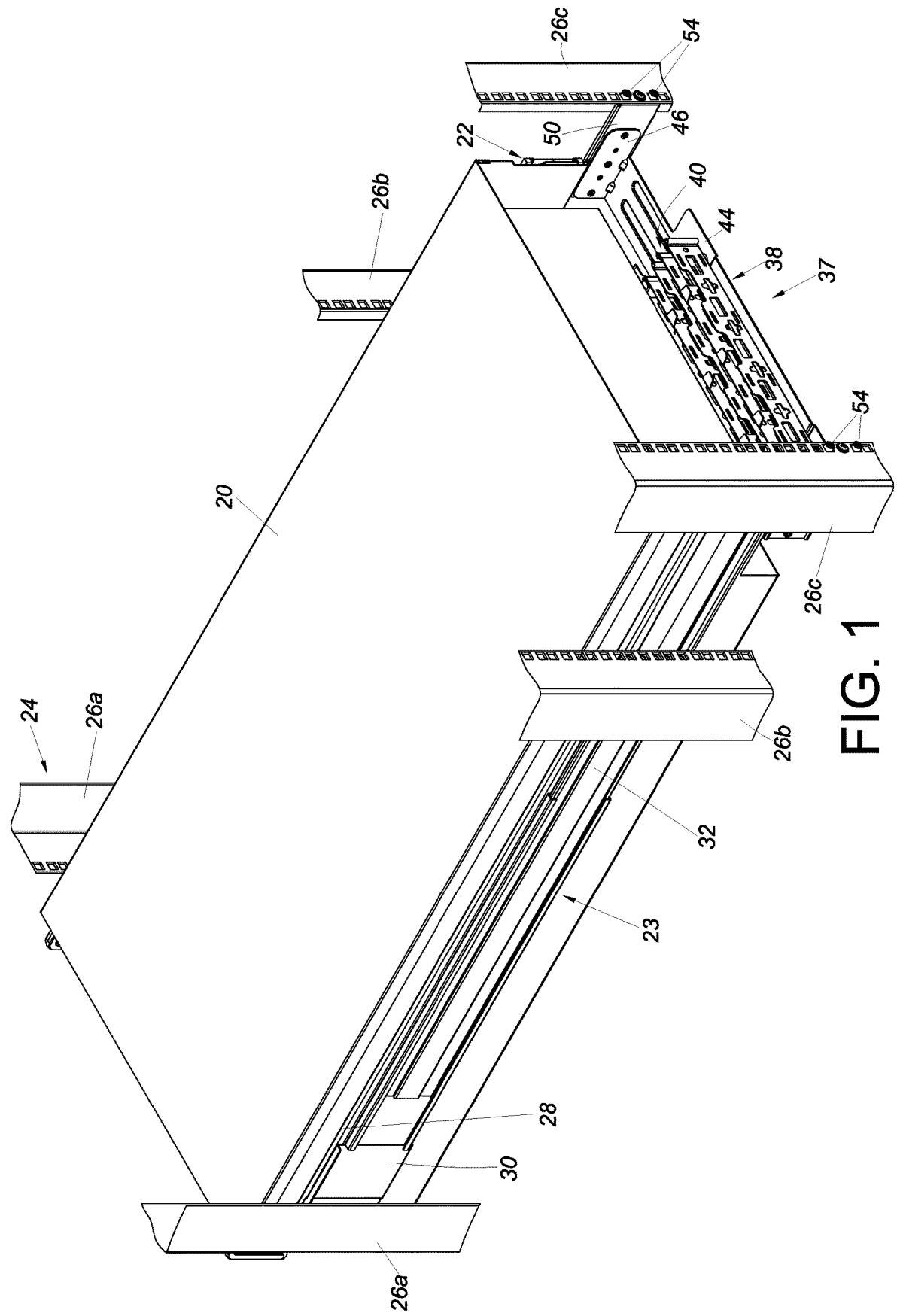
FIG. 1 is a perspective view showing how an object is mounted to a rack via a pair of slide rail assemblies in an embodiment of the present invention, with a cable management device trailing behind the object.

Referring to FIG. 1, a rack system includes an object 20 that is mounted to a rack 24 via a first slide rail assembly 22 and a second slide rail assembly 23. The object 20 may be a piece of electronic equipment, such as a server and/or a power supply. The rack 24 includes a pair of first posts 26a and a pair of second posts 26b. In this embodiment, the rack 24 further includes a pair of third posts 26c, and the pair of second posts 26b are located between the pair of first posts 26a and the pair of third posts 26c. Each slide rail assembly 22 or 23 includes a first rail 28. Each first rail 28 has two portions respectively arranged with a first bracket 30 (e.g., a front bracket) and a second bracket 32 (e.g., a rear bracket) configured to be mounted to a corresponding one of the first posts 26a and a corresponding one of the second posts 26b of the rack 24 respectively.

Figure 2:
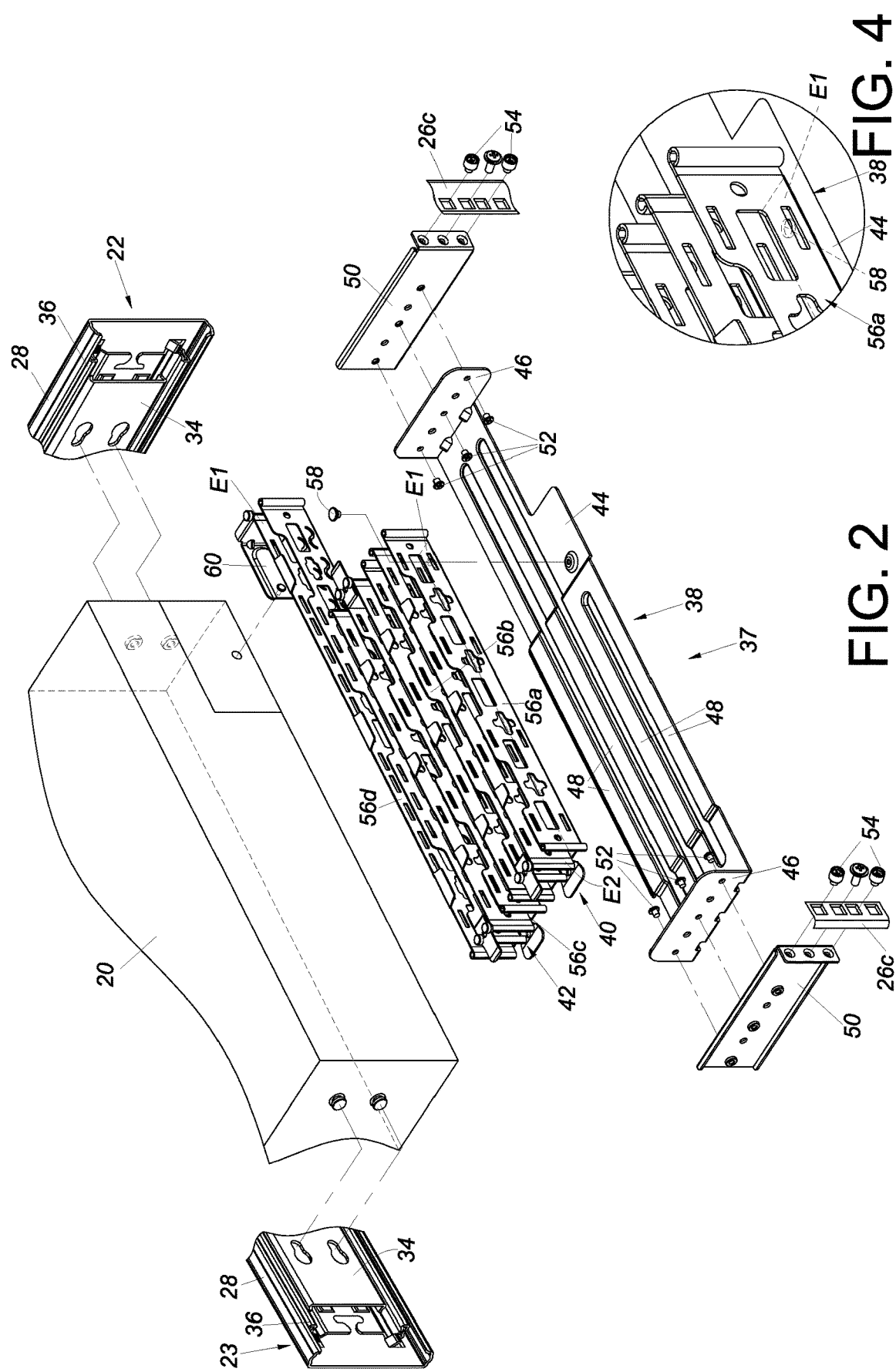
FIG. 2 is an exploded perspective view of the cable management device, the rack, the object, and the slide rail assemblies in an embodiment of the present invention.

As shown in FIG. 2, each slide rail assembly 22 or 23 further includes a second rail 34 and a third rail 36. The second rails 34, on which the object 20 is mountable, are each configured to be moved with respect to the corresponding first rail 28. Each third rail 36 is movably mounted between the corresponding first rail 28 and the corresponding second rail 34 to increase the maximum distance for which the corresponding second rail 34 can be moved with respect to the corresponding first rail 28. In addition, the rack system includes a cable management device 37 located behind the object 20. More specifically, the cable management device 37 includes a supporting base 38, a first set of arms 40, and a second set of arms 42.

In this embodiment, the supporting base 38 is configured to be mounted to the third posts 26c. More specifically, the supporting base 38 includes a supporting portion 44 and at least one wing portion 46. Here, two wing portions 46 are respectively provided on two opposite sides of the supporting portion 44 by way of example. The supporting portion 44 serves to support the first set of arms 40 and/or the second set of arms 42. Preferably, the supporting portion 44 includes at least one rib 48, and in this embodiment, a plurality of ribs 48 are provided by way of example. The ribs 48 have a predetermined height and are arranged at intervals.

Each wing portion 46 is bent with respect to the supporting portion 44 and enables the supporting base 38 to be mounted to an article. For example, each wing portion 46 is mounted to a corresponding one of the third posts 26c through a fitting 50 in the following manner. Each wing portion 46 is connected to the corresponding fitting 50 by a plurality of locking members 52. And, each fitting 50 is mounted to the corresponding third post 26c by a plurality of mounting members 54.

Figure 3:
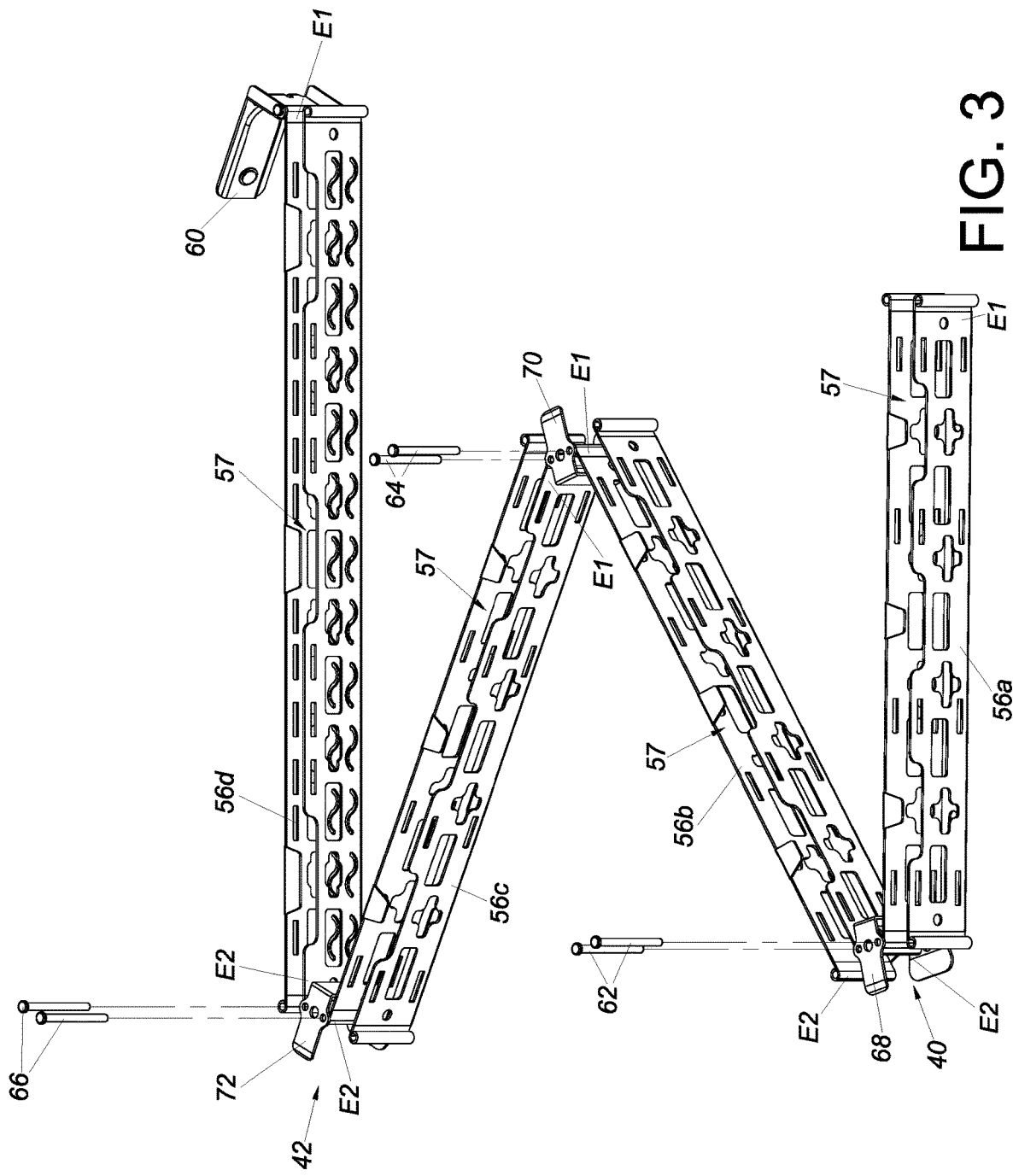
FIG. 3 shows that the cable management device in an embodiment of the present invention includes a plurality of arms that are connected to one another.

As shown in FIG. 2 and FIG. 3, the first set of arms 40 include two arms, such as a first arm 56a and a second arm 56b. The second set of arms 42 also include two arms, such as a third arm 56c and a fourth arm 56d. The arms 56a, 56b, 56c, and 56d have at least one cable management feature 57. In this embodiment, for example, each of the arms 56a, 56b, 56c, and 56d has a cable management feature 57. The cable management features 57 may be grooves, cable holders, or other structures where cables (not shown) of the object 20 can be placed. As the cable arrangement features of a cable management arm are well known in the art, further description is omitted herein for the sake of brevity.

The first arm 56a and the second arm 56b of the first set of arms 40 can move with respect to each other, and the third arm 56c and the fourth arm 56d of the second set of arms 42 can move with respect to each other. The second set of arms 42 are connected to the first set of arms 40. More specifically, the third arm 56c of the second set of arms 42 is connected to the second arm 56b of the first set of arms 40 in such a way that the third arm 56c and the second arm 56b can move with respect to each other. Besides, the fourth arm 56d of the second set of arms 42 is longer than the third arm 56c, the second arm 56b, and/or the first arm 56a in order to increase the overall extended length of the arms 56a, 56b, 56c, and 56d.

Furthermore, each arm 56a, 56b, 56c, or 56d includes two portions (e.g., a first end portion E1 and a second end portion E2 that are located at two opposite ends of each arm respectively) configured for terminal connection. The first arm 56a of the first set of arms 40 is movably mounted on the supporting base 38. For example, the first end portion E1 of the first arm 56a is pivotally connected to the supporting portion 44 of the supporting base 38 via a shaft member 58 (see FIG. 2 and FIG. 4). The ribs 48 on the supporting portion 44 serve to support the arms 56a, 56b, 56c, and 56d so that the arms 56a, 56b, 56c, and 56d will not sag excessively due to the weight of the cables of the object 20 while supporting the cables. The fourth arm 56d of the second set of arms 42 has its first end portion E1 mounted on the object 20. For example, the first end portion E1 of the fourth arm 56d is pivotally connected with an accessory 60 and is mounted to the rear side of the object 20 via the accessory 60.

As shown in FIG. 3, the arms 56a, 56b, 56c, and 56d are sequentially and pivotally connected by at least one first pivotal connection element 62, at least one second pivotal connection element 64, and at least one third pivotal connection element 66. More specifically, the second end portions E2 of the first arm 56a and the second arm 56b of the first set of arms 40 are pivotally connected by two first pivotal connection elements 62 (e.g., with a first auxiliary base 68 arranged between the first arm 56a and the second arm 56b to facilitate pivotal connection by the first pivotal connection elements 62), the first end portion E1 of the second arm 56b of the first set of arms 40 and the first end portion E1 of the third arm 56c of the second set of arms 42 are pivotally connected by two second pivotal connection elements 64 (e.g., with a second auxiliary base 70 arranged between the second arm 56b and the third arm 56c to facilitate pivotal connection by the second pivotal connection elements 64), and the second end portion E2 of the third arm 56c of the second set of arms 42 and the second end portion E2 of the fourth arm 56d of the second set of arms are pivotally connected by two third pivotal connection elements 66 (e.g., with a third auxiliary base 72 arranged between the third arm 56c and the fourth arm 56d to facilitate pivotal connection by the third pivotal connection elements 66). The foregoing arrangement makes it possible for the arms 56a, 56b, 56c, and 56d to move with respect to one another. It is worth mentioning that, while the arms 56a, 56b, 56c, and 56d in this embodiment are pivotally connected through the additional auxiliary bases 68, 70 and 72, it is feasible in practice that the arms 56a, 56b, 56c, and 56d are pivotally connected directly by the pivotal connection elements; the present invention has no limitations in this regard.

Figure 5:
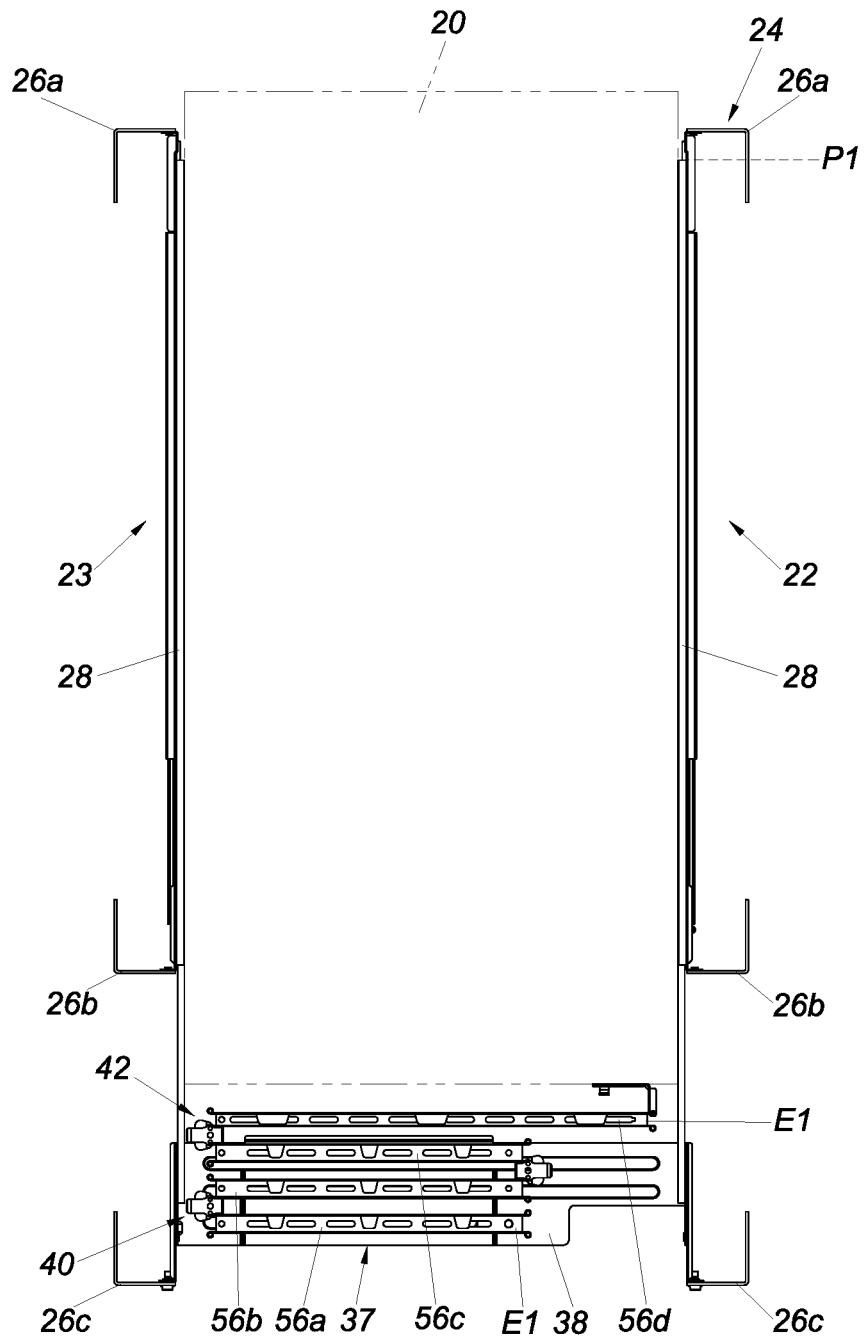
FIG. 5 shows that an object is mounted on the rack via the slide rail assemblies, that the cable management device is in a first state, and that the supporting base is mounted on the rack.

Referring to FIG. 5, the slide rail assemblies 22 and 23 are shown in a retracted state. The first rail 28 of each slide rail assembly 22 or 23 is mounted on the corresponding first post 26a and the corresponding second post 26b of the bracket 24 via the aforesaid brackets respectively. The supporting base 38 is mounted on the third posts 26c. The first end portion E1 of the first arm 56a of the cable management device 37 is movably (e.g., pivotally) connected to the supporting base 38 while the first end portion E1 of the fourth arm 56d of the cable management device 37 is mounted on the object 20. When the slide rail assemblies 22 and 23 are in the retracted state, the second rails 34 and the third rails 36 are at a first position P1 with respect to the first rails 28, and most of the object 20 lies in the rack 24. On the other hand, the first set of arms 40 and the second set of arms 42 of the cable management device 37 are in a first state, e.g., a state in which the arms 56a, 56b, 56c, and 56d of the cable management device 37 are close to one another.

Figure 6:
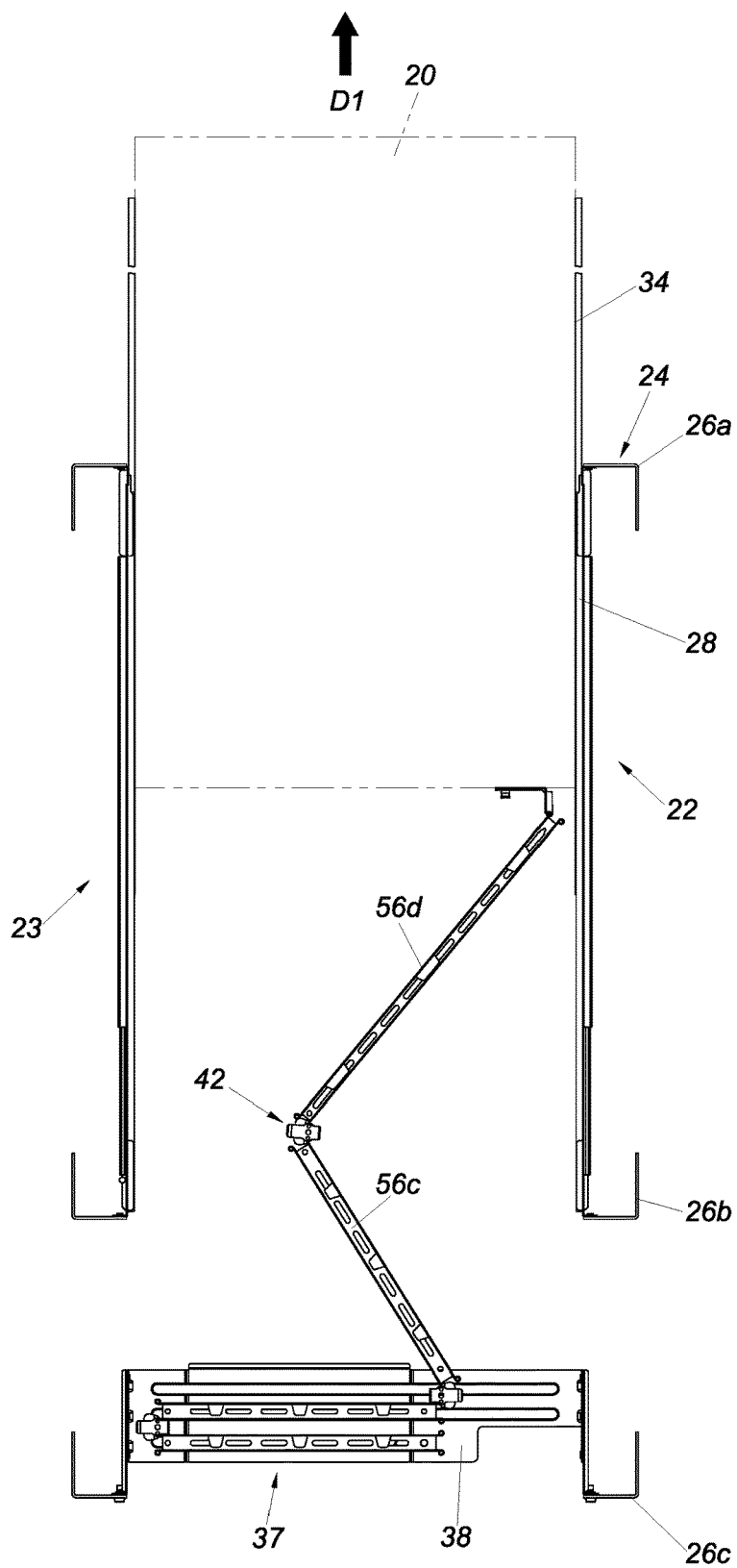
FIG. 6 shows that the second rails of the slide rail assemblies in FIG. 5 have been moved in a certain direction with respect to the first rails such that the arms of the cable management device are entering a second state.

Referring to FIG. 6 in conjunction with FIG. 5, when the second rails 34 are moved in a first direction D1 (e.g., an extending direction) with respect to the first rails 28 from the first positon P1, the object 20 is displaced outward of the rack 24 along with the second rails 34 in the first direction D1. More specifically, in the course in which the second rails 34 are moved in the first direction D1, the fourth arm 56d of the second set of arms 42 is moved in response to the second rails 34 moving in the first direction D1 with respect to the first rails 28 from the first position P1, and the third arm 56c is moved by the fourth arm 56d as a result. Thus, the fourth arm 56d and the third arm 56c are gradually brought into a second state, e.g., an opened state, with respect to each other. It is worth mentioning that the first rails 28 and the supporting base 38 are stationary with respect to the second rails 34 due to the fact that the first rails 28 are mounted on the first posts 26a and the second posts 26b and that the supporting base 38 is mounted on the third posts 26c. In other words, the second rails 34 can move with respect to the first rails 28 and/or the supporting base 38.

Figure 7:
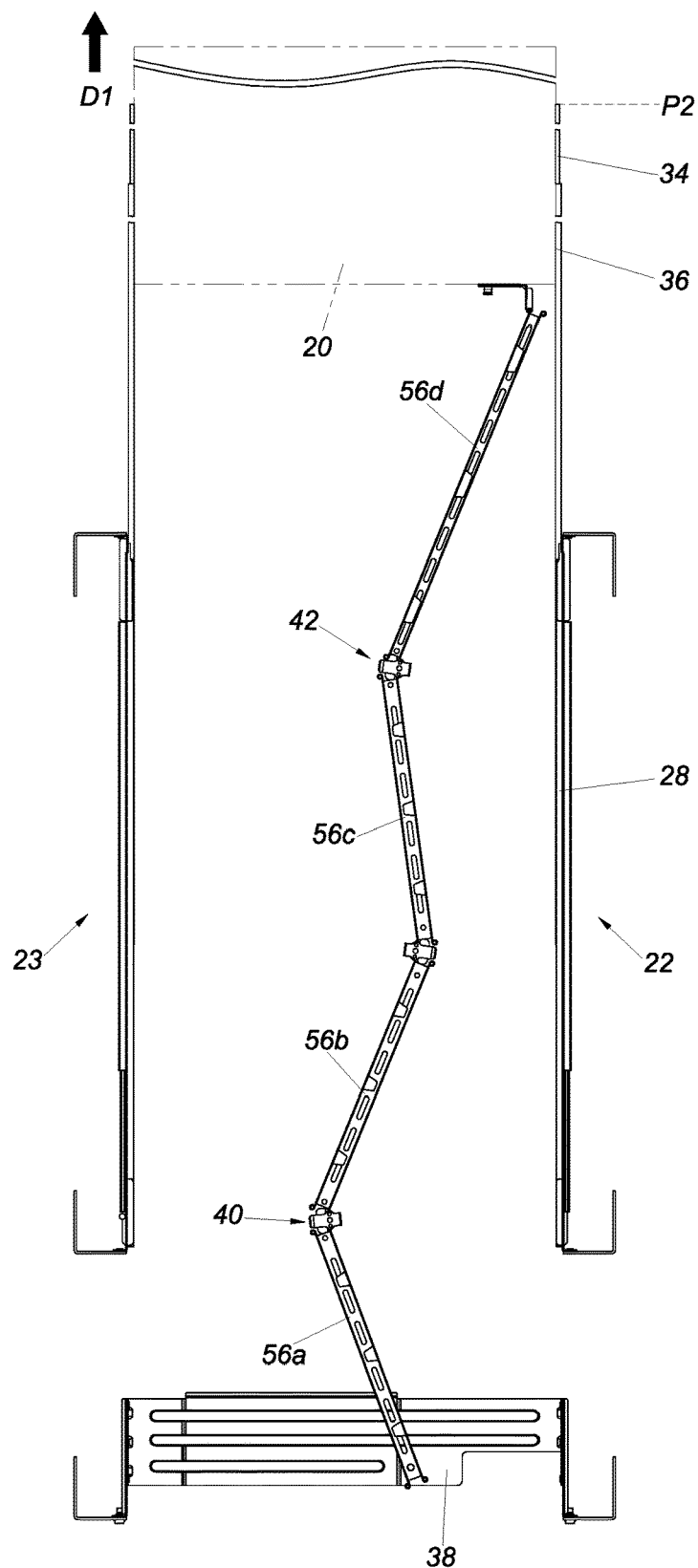
FIG. 7 shows that the second rails of the slide rail assemblies in FIG. 6 are further moved in the same direction with respect to the first rails such that the arms of the cable management device are in the second state.

Referring to FIG. 7 in conjunction with FIG. 6, when the second rails 34 and/or the third rails 36 are further moved in the first direction D1 with respect to the first rails 28 to a second position P2 where the slide rail assemblies 22 and 23 are fully extended, the object 20 is displaced out of the rack 24 in the first direction D1 along with the second rails 34 and/or the third rails 36. During the process, the third arm 56c of the second set of arms 42 is further moved by the fourth arm 56d and in turn moves the second arm 56b and the first arm 56a of the first set of arms 40 such that the second set of arms 42 and the first set of arms 40 are in the second state, e.g., a fully opened state, with respect to each other.

It is worth mentioning that, when the second rails 34 and/or the third rails 36 are subsequently moved in a second direction (e.g., a retracting direction, which is the opposite direction of the first direction D1) with respect to the first rails 28 from the second position P2 back to the first position P1, the second set of arms 42 and the first set of arms 40 return from the second state to the first state (the process of which can be understood by referring to FIG. 5 and therefore will not be described herein).

Figure 8:
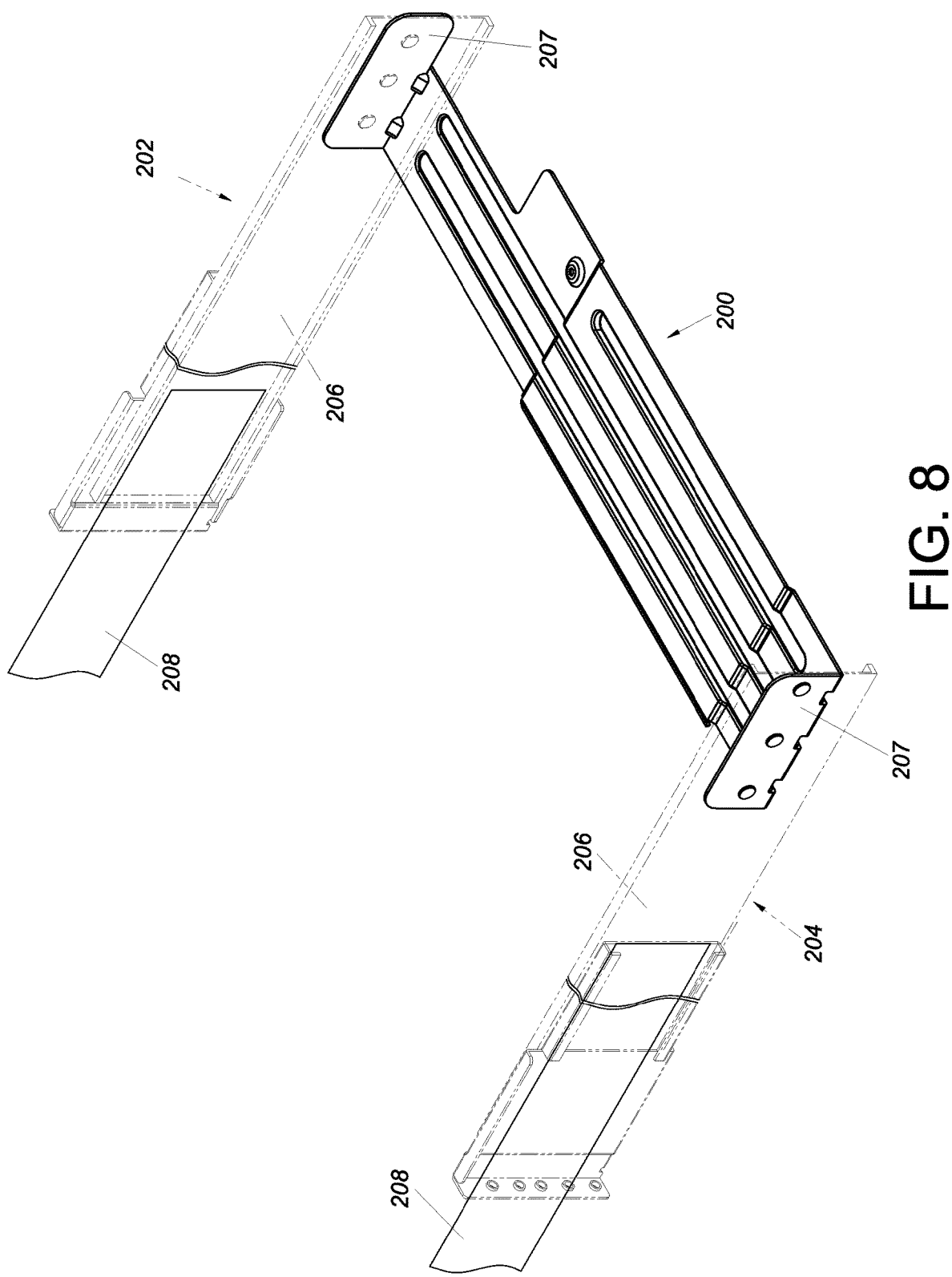
FIG. 8 shows that the supporting base of the cable management device in another embodiment of the present invention is mounted on the first rail of a slide rail assembly.
Figure 9:
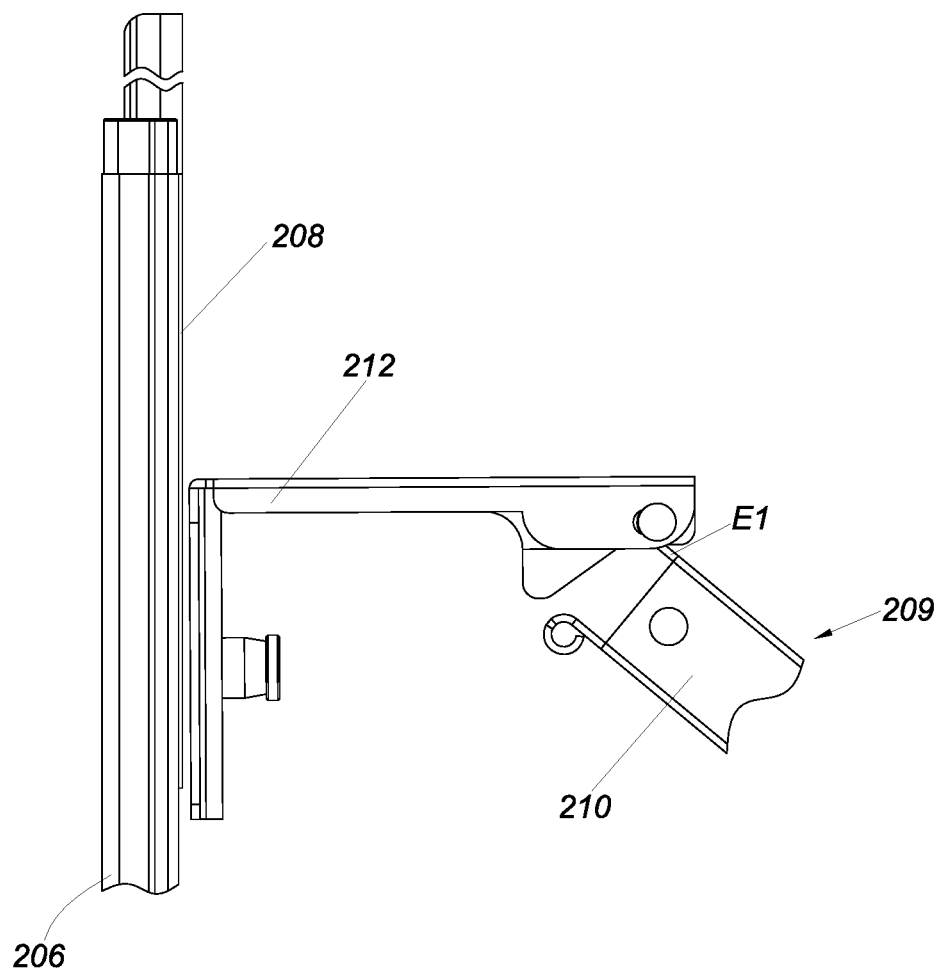
FIG. 9 shows that one of the arms of the cable management device in the embodiment of FIG. 8 is mounted on the second rail of the slide rail assembly.

FIG. 8 shows another embodiment of the present invention. Unlike the supporting base 38 in the previous embodiment, which is mounted on the third posts 26c, the supporting base 200 in this embodiment is mounted on the first rail 206 of the first slide rail assembly 202 (or of the second slide rail assembly 204). For example, the supporting base 200 is mounted to the first rail 206 through a corresponding one of the wing portions 207 by threaded connection, welding, mechanical engagement, fastening, or the like and is thus fixed in position with respect to the first rails 206, just like its counterpart in the previous embodiment. In addition, referring to FIG. 9, the first end portion E1 of the fourth arm 210 of the second set of arms 209 in this embodiment is mounted on the corresponding second rail 208. For example, the first end portion E1 of the fourth arm 210 is mounted to the corresponding second rail 208 via an accessory 212. According to this arrangement, the fourth arm 210 is equally capable of moving in response to the second rails 208 moving with respect to the first rails 206.

While the present invention has been disclosed through the foregoing preferred embodiments, it should be understood that the embodiments provided herein are not intended to be restrictive of the scope of the invention. The scope of patent protection sought by the applicant is defined by the appended claims.

What is claimed is:

1. A slide rail assembly, comprising:
   a first rail;
   a second rail; and
   a cable management device including:
   a supporting base,
   a first set of arms including first and second arms that are pivotally connected to each other, wherein the first arm of the first set of arms is pivotally connected to the supporting base, and
   a second set of arms including first and second arms that are pivotally connected to each other, wherein the first arm of the second set of arms is pivotally connected to the second arm of the first set of arms;
   wherein the second rail is movable with respect to the first rail and the supporting base; and
   wherein the second set of arms and the first set of arms are movable from a first state to a second state in response to the second rail moving with respect to the first rail from a first position to a second position.

2. The slide rail assembly of claim 1, wherein the second arm of the second set of arms is movable in response to the second rail moving with respect to the first rail from the first position to the second position.

3. The slide rail assembly of claim 1, further comprising a third rail movably mounted between the first rail and the second rail, wherein the supporting base is mounted on the first rail.

4. The slide rail assembly of claim 1, wherein the supporting base includes a supporting portion and a wing portion, the first arm of the first set of arms is movably mounted on the supporting portion, and the wing portion enables the supporting base to be mounted to the first rail.

5. The slide rail assembly of claim 4, wherein the supporting portion of the supporting base includes a plurality of ribs for supporting the first set of arms and/or the second set of arms.

6. A slide rail assembly adapted for mounting an object to a rack, the slide rail assembly comprising:
   a first rail mountable on a first post and a second post of the rack;
   a second rail movable with respect to the first rail, the second rail being mountable with the object;
   a third rail movably mounted between the first rail and the second rail; and
   a cable management device including:
   a supporting base fixed in position with respect to the first rail,
   a first set of arms including first and second arms that are pivotally connected to each other, wherein the first arm of the first set of arms is pivotally connected to the supporting base, and a second set of arms including first and second arms that are pivotally connected to each other, wherein the first arm of the second set of arms is pivotally connected to the second arm of the first set of arms;

wherein the second set of arms and the first set of arms are movable from a first state to a second state in response to the second rail moving with respect to the first rail from a first position to a second position.

7. The slide rail assembly of claim 6, wherein the second arm of the second set of arms is movable in response to the second rail moving with respect to the first rail from the first position to the second position.

8. The slide rail assembly of claim 6, wherein the supporting base is mounted on one of a third post of the rack and the first rail, and the supporting base includes a supporting portion on which the first arm of the first set of arms is movably mounted.

9. The slide rail assembly of claim 8, wherein the supporting portion of the supporting base includes a plurality of ribs for supporting the first set of arms and/or the second set of arms.

10. The slide rail assembly of claim 9, wherein the first set of arms and the second set of arms have a cable management feature where a cable of the object is placeable.

11. The slide rail assembly of claim 1, wherein the supporting base is fixedly mounted with respect to at least one of the first rail and the rack.

* * * * *